US007023699B2

(12) United States Patent
Glovatsky et al.

(10) Patent No.: US 7,023,699 B2
(45) Date of Patent: Apr. 4, 2006

(54) LIQUID COOLED METAL THERMAL STACK FOR HIGH-POWER DIES

(75) Inventors: Andrew Z. Glovatsky, Plymouth, MI (US); Vivek Jairazbhoy, Farmington Hills, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 220 days.

(21) Appl. No.: 10/458,424

(22) Filed: Jun. 10, 2003

(65) Prior Publication Data

US 2003/0227750 A1 Dec. 11, 2003

Related U.S. Application Data

(60) Provisional application No. 60/387,621, filed on Jun. 10, 2002.

(51) Int. Cl.
*H05K 7/20* (2006.01)

(52) U.S. Cl. .................... 361/704; 165/80.3; 165/185; 257/719; 361/705; 361/708; 361/710; 361/715; 361/719

(58) Field of Classification Search ............... 165/80.2, 165/80.3, 185; 174/16.3; 257/712–713, 257/718–719; 361/688–721
See application file for complete search history.

(56) References Cited

U.S. PATENT DOCUMENTS

| | | | | | |
|---|---|---|---|---|---|
| 4,233,645 | A | * | 11/1980 | Balderes et al. | 361/698 |
| 5,459,352 | A | * | 10/1995 | Layton et al. | 257/724 |
| 5,623,394 | A | * | 4/1997 | Sherif et al. | 361/705 |
| 5,812,375 | A | * | 9/1998 | Casperson | 361/707 |
| 6,151,215 | A | * | 11/2000 | Hoffman | 361/704 |
| 6,365,964 | B1 | * | 4/2002 | Koors et al. | 257/718 |

* cited by examiner

*Primary Examiner*—Gregory D Thompson
(74) *Attorney, Agent, or Firm*—Brinks Hofer Gilson & Lione

(57) ABSTRACT

The present invention provides a system for conducting heat away from an electrical component wherein the system has an elastically deformable member providing thermal communication with an electrical component. The system for conducting heat energy in an electronic assembly includes an electrical component, an elastically deformable member, and a housing. The elastically deformable member is placed in a compressed position between the electrical component and the housing such that the elastically deformable member is fixed into an assembled location. The elastically deformable member conducts heat energy away from the electrical component into the housing where it is dissipated into the environment. Since the compressed position fixes the location of the elastically deformable member, the system does not require a mechanical fastening to the electrical component thereby reducing thermo-mechanical fatigue. The elastically deformable member is made of a metal material allowing it to easily conduct the heat energy.

41 Claims, 3 Drawing Sheets

LIQUID COOLED METAL THERMAL STACK FOR HIGH-POWER DIES

CROSS REFERENCE TO RELATED APPLICATION

The present invention claims priority to U.S. Provisional Application Ser. No. 60/387,621, filed Jun. 10, 2002, entitled "Power electronics thermal management".

BACKGROUND

1. Field of the Invention

The present invention generally relates to a system for transferring heat from electrical components.

2. Description of Related Art

Thermal management is a critical issue that must be considered during the development of electronic assemblies. With the advances in the functionality of electrical components, power and heat dissipation requirements for electronic assemblies have increased. In addition, the development of bare die packages that do not have housings or heat sinks has created a need for systems and methods that can conduct the heat away from the silicon die. Current methods include physical interconnects which have the undesired effect of increasing the thermo-mechanical fatigue applied to the electronic assembly.

The desired path for conducting heat away from the die is through the top or bottom of the die. Typically, conducting heat through the bottom of the die requires the addition of heat sinks mechanically attached to the electrical component to improve the thermal conduction. The heat sink is usually incorporated in the die package in an overmolding process. The heat sink is then soldered to thermal vias or mechanically fastened to the housing of the module. Incorporating heat sinks into the electrical component adds cost to the component. Electrical components which are fastened to a heat sink or the module housing require a pad or clip for fastening. Processing mechanically fastened components adds cost and operations to the manufacture of an electronic assembly.

In view of the above, it is apparent that there exists a need for a system and method for conducting heat from electrical components that provides improved heat dissipation and provides an easy to manufacture thermal connection to the electrical components.

SUMMARY

In satisfying the above need, as well as overcoming the enumerated drawbacks and other limitations of the related art, the present invention provides a system for conducting heat away from an electrical component. The system includes a deformable member that provides a thermal communication path to the electrical component for extracting heat from the component.

The system for transferring heat energy in an electronic assembly includes an electrical component, an elastically deformable member, and a housing. The elastically deformable member is placed in a compressed position between the electrical component and the housing such that the elastically deformable member is fixed into an assembled location. The elastically deformable member conducts heat energy away from the electrical component into the housing where it is dissipated into the environment. Since the compressed position fixes the location of the elastically deformable member, the system does not require a mechanical fastening to the electrical component thereby reducing thermo-mechanical fatigue.

The elastically deformable member is made of a metal material allowing it to easily conduct the heat energy. More specifically, the elastically deformable member can be made of a metal foam. The metal foam is porous increasing the surface area of the elastically deformable member allowing it to more quickly dissipate heat. In addition, the porous nature of the metal foam can allow it to contain a thermally conductive liquid or grease to increase thermal conductance. Metal foam also provides many possible techniques for fixing the elastically deformable member to the housing.

The present invention also provides for a counter support to reduce the amount of mechanical fatigue on the component caused by the compression force of the elastically deformable member. The counter support can be an extension of the housing or an individual piece made of elastomer, metal foam or other elastic material.

Further objects, features and advantages of this invention will become readily apparent to persons skilled in the art after a review of the following description, with reference to the drawings and claims that are appended to and form a part of this specification.

DETAILED DESCRIPTION

Figure 1:
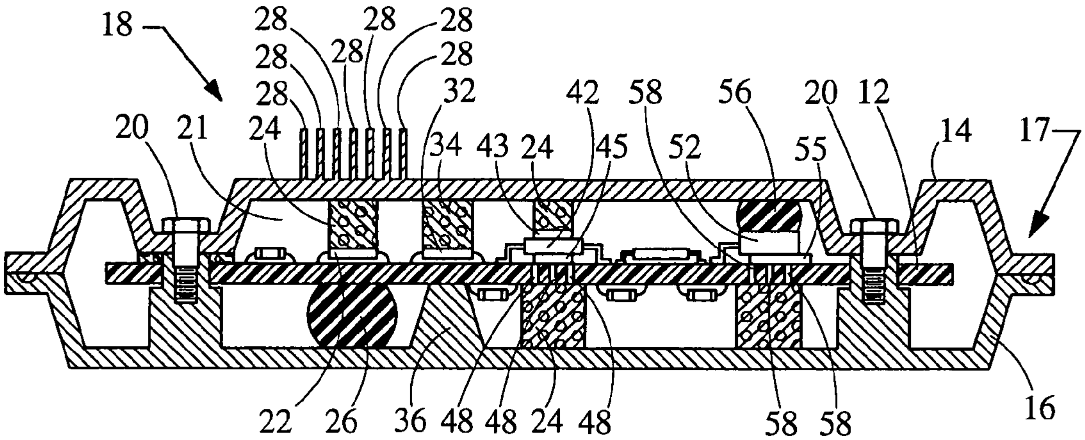
FIG. 1 is a side cutaway view of an electronic assembly showing a system for conducting heat energy away from an electrical component according to the present invention.

Referring now to FIG. 1, a electronic assembly 18 configured to transfer heat from an electrical component embodying the principles of the present invention is illustrated therein. Assembly 18 includes an electrical component 22 and an elastically deformable member 24. Electronic assembly 18 has a circuit board 12 with electrical components mounted on the circuit board 12. Electronic assembly 18 also has a housing 17 including a top half 14 and a bottom half 16 that are fastened together with screws 20 to protect and support the printed circuit board 12. Heat generated by electrical components 22 needs to be conducted away from the electrical components to provide for the proper functioning of the electrical components.

The elastically deformable member 24 contacts electrical components 22 at a first end and housing 17 at a second end. In an embodiment of the present invention, deformable member 24 is attached to the housing 17 and is compressed between the housing 17 and the electrical component 22 when the electronic assembly 18 is assembled. The compression force generated by the elastically deformable member 24 ensures physical contact between both housing 17 and electrical component 22. While embodiments of the present invention provide for mechanically attaching deformable member 24 to housing 17 it should be understood that device 24 need not be mechanically fastened to electrical component 22.

Deformable member 24 is made of a thermally conductive material and conducts the heat away from electrical component 22. For example, deformable member 24 includes a metal material and is in an embodiment of the present invention a metal foam. Metal foam is commercially available such as RECEMAT® metal foam provided by Recemat International of the Netherlands. Metal foam is an excellent thermal conductor and is very porous. The porosity of the metal foam provides a very large surface area that facilitates heat dissipation. The porosity of the metal foam also allows deformable member 24 to contain grease or liquids which improve the heat transfer rate between component 22 and deformable member 24. One such commercially available liquid is FLOURINERT® provided by 3M® of St. Paul, Minn. These materials are especially effective at the interfacing surface between deformable member and the electrical component 22 for high vibration applications.

The heat energy transferred by deformable member 24 is either transferred to housing 17 or dissipated into the cavity 21 of electronic assembly 18. The air in the cavity 21 may be static or forced. The natural convection that occurs enhances heat transfer from electrical component 22. The heat that is transferred to housing 17 is dissipated into the environment. Features such as fins 28 may be used to further increase the surface area of the housing and improve the dissipation of the heat energy into the environment.

The compression force created by deformable member 24 is balanced by a counter support 26 made of an elastomeric material. The counter support 26 improves the physical contact of the elastically deformable member 24 with the electrical component 22 by preventing the compression force generated by deformable member 24 from flexing printed circuit board 12. Further, counter support 26 reduces mechanical fatigue on the connections between the printed circuit board 12 and the electrical component 22.

Still referring to FIG. 1, deformable member 34 is shown in contact with another electrical component 32 that generates heat during operation. In another embodiment of the present invention counter support 36 is shown as an extension of housing 17 and again functions to prevent flexing of printed circuit board 12.

Other electrical components, such as electrical component 42 includes heat sinks 43 and 44 embedded in a surface of electrical component 42 to enhance the transfer of heat energy away from electrical component 42. The use of deformable member 24 further enhances the dissipation of the heat transferred through heat sink 43 by providing a heat conduction path to the heat sink. As previously mentioned, the porosity of deformable member 24 will increase the surface area allowing the heat energy to more quickly dissipate into cavity 21 of electronic assembly 18. Further, deformable member 24 will transfer heat energy to housing 17 for dissipation into the surrounding environment. Thermal vias 48 are also provided in printed circuit board 12 to enhance the transfer of heat from heat sink 45 disposed on one side of the printed circuit board 12 through the printed circuit board 12 to an additional deformable member 24 disposed in the other side of printed circuit board 12 to dissipate the heat energy within the cavity 21 and transfer heat energy to housing 17.

Alternatively, other electrical components such as electrical component 52, shown as a T0220 package, includes a heat sink 53 mechanically fastened to printed circuit board 12. Thermal vias 58 are provided and are primarily used to transfer the heat to deformable member 54, where the heat energy is dissipated into cavity 21 or transferred to housing 17. To counteract the compression force created by deformable member 54, a counter support 56 shown as an elastomer is placed between housing 17 and electrical component 52 to reduce mechanical fatigue.

Figure 2:
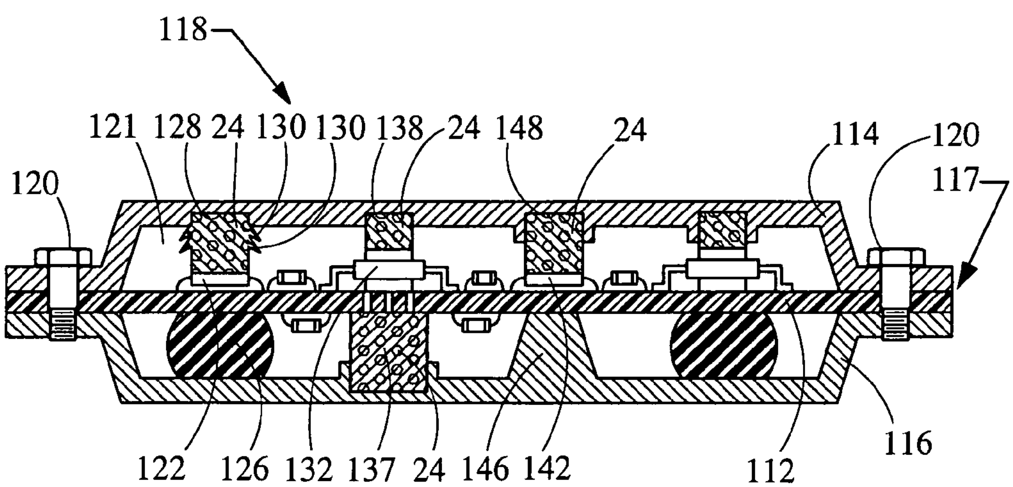
FIG. 2 is a side cutaway view of another embodiment of a system for thermally conducting heat from an electrical component according to the present invention.

Referring to FIG. 2, another embodiment of the present invention is illustrated as electronic assembly 118. Electronic assembly 118 includes again deformable member 24 and a plurality of electrical components. Similar to the previous embodiments, electronic assembly 118 further includes a printed circuit board 112 and a housing 117 formed by a top shell 114 and a bottom shell 116 joined by fasteners 120. In the present embodiment, housing 117 contains a recess 128 for receiving deformable member 124. Recess 128 allows the deformable member 124 to be manufactured as an independent replaceable piece that is a press fit into recess 128 of housing 117 during assembly. Similar to the previous embodiments, deformable member 124 is preferably made out of a metal foam material. Deformable member 124 is compressed between recess 128 of housing 117 and electrical component 122 to provide a physical contact therebetween. The compressed deformable member 124 facilitates thermal conduction of heat energy away from electrical component 122. The heat energy conducted by deformable member 124 is either dissipated into cavity 121 of electronic assembly 118 or transferred through the surface of recess 128 to housing 117 to be dissipated by housing 117 and to the environment. Further, the deformable member 124 may include projections 130 to increase the surface area of the deformable member 124 and facilitate the dissipation of heat.

The present embodiment also provides for a counter support 126 to reduce thermal fatigue caused by the compression force of deformable member 124.

With continuing reference to FIG. 2, deformable member 24 made as an independent insert can also be used as the counter support. Electrical component 132 is mounted to printed circuit board 112 containing vias 139 for transferring heat energy through printed circuit board 112. Deformable member 24 conducts heat from the top surface of electrical component 132 and dissipates the heat energy into cavity 121 of housing 117 or transfers the heat energy by conduction to housing 117 through a surface of recess 138 to housing 117. Similarly, deformable member 24 disposed opposite component 132 acts as a counter support. Deformable member 24 being compressed between recess 137 and housing 117 and printed circuit board 112 provides a compression force to reduce the mechanical fatigue caused by the compression force of deformable member 24. In addition, deformable member 24 also transfers heat energy from the vias 139 and dissipates the heat energy into the cavity 121 or transfers the heat energy to the housing 117.

The size and shape of recesses disposed in housing 117 can have many forms. For example, deformable member 24 is received in recess 148 that is elongated to provide additional support to deformable member 24. The shape of the recess 148 may also be modified to increase or decrease the surface area thereby changing the amount of heat energy transferred to housing 117 relative to the amount of heat energy dissipated in cavity 121.

Figure 3A:
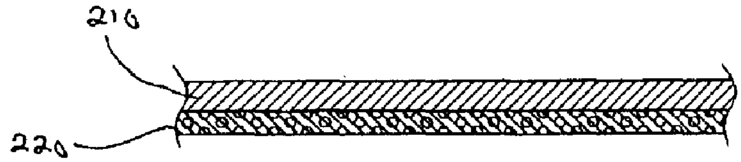
FIG. 3A is a side cutaway view of a housing of an electronic assembly showing an elastically deformable layer used for forming elastically deformable members to conduct heat from electrical components.
Figure 3B:
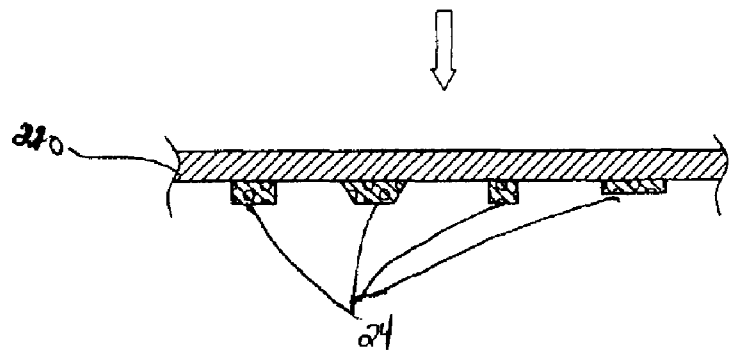
FIG. 3B is a cutaway view of a housing of an electronic assembly showing elastically deformable members for conducting heat away from an electrical component formed from the elastically deformable layer shown in FIG. 3A.

Referring now to FIGS. 3A and 3B, deformable member 24 may be attached to housing 210 by soldering a deformable layer 220 to the inside of housing 210. Deformable layer 220 is made of a material such as the metal foam periodically described. Deformable layer 220 can be machined to form deformable members 24 as shown in FIG. 3B. The deformable members 24 may be machined in different shapes and sizes. The shape of deformable member 24 may be changed to accommodate the shape of any particular electrical component, the size of the electrical component, and the distance from housing 210 to the electrical component. In addition, the shape of the deformable member can be made to increase the surface area to provide better heat dissipation.

Figure 4A:
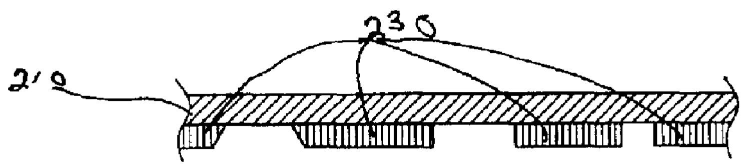
FIG. 4A is a side cutaway view of a housing of an electronic assembly showing a removable mask attached to the housing.
Figure 4B:
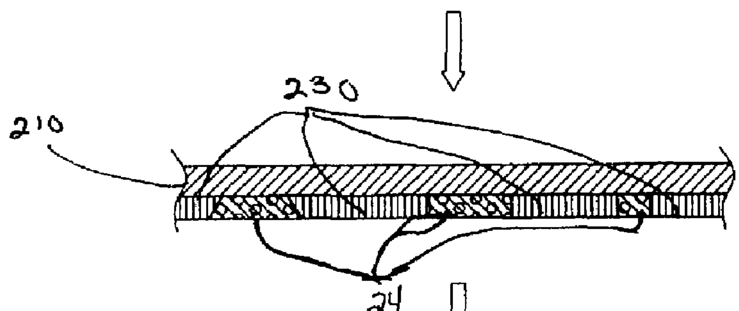
FIG. 4B is a side cutaway view of a housing of an electronic assembly showing an elastically deformable material being deposited on the housing.

Referring now to FIGS. 4A and 4B, a portion of a housing 210 of an electronic assembly is illustrated attached to a mask 230 made of resist or removable sintering filler. A deformable material 24 is applied to housing 210. Deformable material 24 is sintered attaching to housing 210 on regions 228 of housing 210 where the mask 230 is not applied.

Figure 4C:
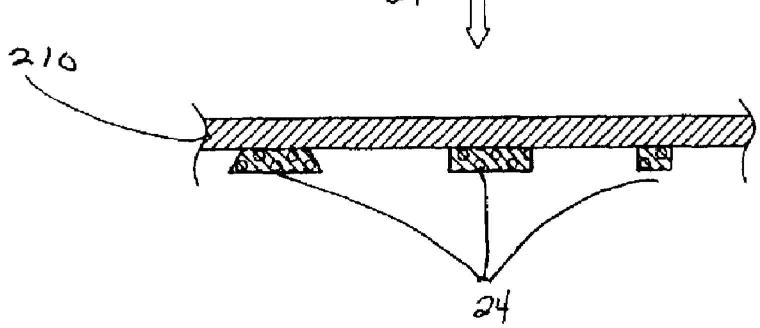
FIG. 4C is a side cutaway view of a housing of an electronic assembly showing the elastically deformable members for thermally conducting heat away from an electrical component after the mask shown in FIGS. 4A and 4B is removed.

Referring now to FIG. 4C, mask 230 is removed leaving deformable members 24 attached to housing 210. The depth and shape of the mask can be varied to result in deformable members 24 having various shapes and sizes.

Figure 5A:
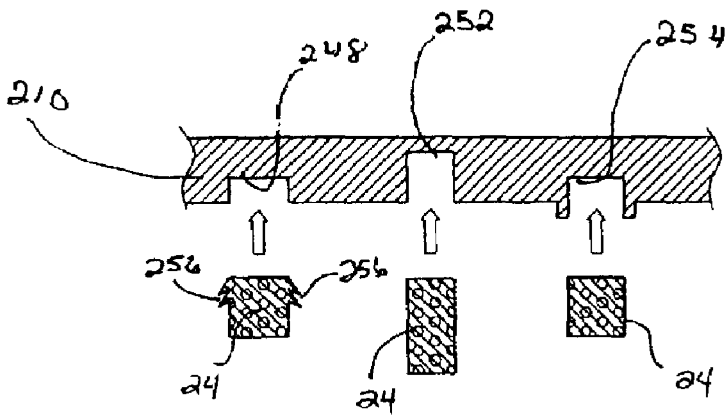
FIG. 5A is a side cutaway view of a housing of an electronic assembly showing a cavity for receiving elastically deformable members.
Figure 5B:
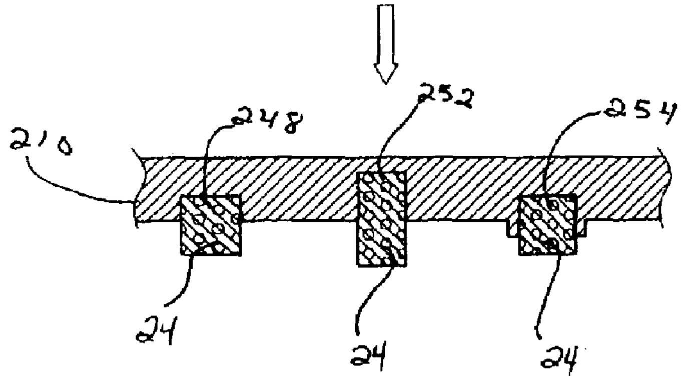
FIG. 5B is a side cutaway view of a housing of an electronic assembly showing the elastically deformable members inserted into the cavities of the housing.

Referring now to FIG. 5A, housing 210 is manufactured with recesses 248, 252 and 254 for receiving deformable member 24 having various configurations. Deformable members 24 may be manufactured independently and press fit into recess 248, 252 and 254 of housing 210. As specifically shown on deformable member 24 to be received in recess 248, barbs 256 may be incorporated into deformable member 24 to aid in the retention of deformable member 24 into recess 248. Further, deformable members 24 are manufactured as inserts allowing easy replacement of same.

Figure 6A:
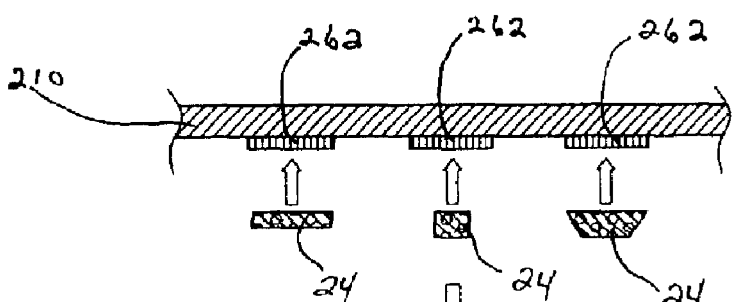
FIG. 6A is a side cutaway view of the housing of an electronic assembly showing pads on the metal housing for attaching the elastically deformable members.
Figure 6B:
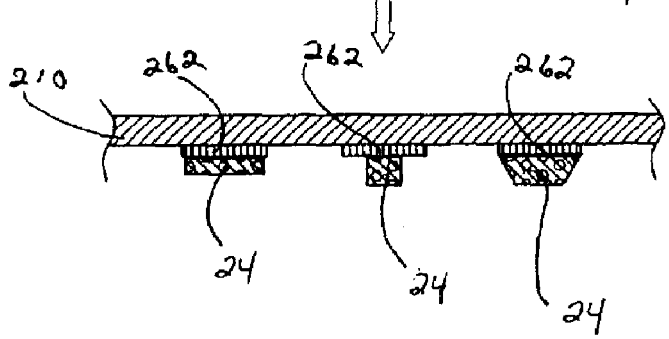
FIG. 6B is a side cutaway view of a housing of an electronic assembly showing the elastically deformable members attached to the pads on the housing for conducting heat from an electrical component.

Referring now to FIGS. 6A and 6B, in another embodiment of the present invention, housing 210 is illustrated having pads 262 to aid in the attachment of deformable members 24. The pads 262 can be made of solder or brazed material that may be used to form a mechanical bond with deformable member 24. The mechanical bond of deformable member 24 to pad 262 aids in the transfer of heat energy from deformable member 24 to housing 210.

As a person skilled in the art will readily appreciate, the above description is meant as an illustration of implementation of the principles this invention. This description is not intended to limit the scope or application of this invention in that the invention is susceptible to modification, variation and change, without departing from spirit of this invention, as defined in the following claims.

We claim:

1. A system for transferring heat energy in an electronic assembly, the system comprising:

an electrical component;

a first elastically deformable member in thermal communication with the electrical component and having a compressed position that fixes the first elastically deformable member in an assembled location;

a housing for protecting the electronic assembly, the first elastically deformable member being in thermal communication with the housing; and a printed circuit board in thermal communication with the electrical component.

2. The system according to claim 1, wherein the first elastically deformable member includes a metal material for conducting heat energy.

3. The system according to claim 2, wherein the housing is constructed of the metal material included in the first elastically deformable member.

4. The system according to claim 1, wherein the first elastically deformable member is porous.

5. The system according to claim 1, further comprising a thermally conductive liquid contained within the first elastically deformable member.

6. The system according to claim 1, further comprising a thermally conductive grease in thermal communication with the first elastically deformable member.

7. The system according to claim 1, wherein the first elastically deformable member includes a metal foam.

8. The system according to claim 1, wherein the first elastically deformable member has a shape corresponding to a shape of the electrical component.

9. The system according to claim 1, wherein the first elastically deformable member is mechanically attached to the housing.

10. The system according to claim 1, wherein the first elastically deformable member is soldered to the housing.

11. The system according to claim 1, wherein the first elastically deformable member provides an electrical ground path to the housing.

12. The system according to claim 1, wherein the housing includes a recess for receiving the first elastically deformable member.

13. The system according to claim 12, wherein the first elastically deformable member is press-fit into the recess of the housing.

14. The system according to claim 1, wherein the printed circuit board includes vias for conducting heat energy through the printed circuit board.

15. The system according to claim 1, further comprising a counter support for relieving mechanical stress caused by the first elastically deformable member.

16. The system according to claim 15, wherein the counter support is located opposite the first elastically deformable member.

17. The system according to claim 15, wherein the counter support includes an elastomer material.

18. The system according to claim 15, wherein the counter support includes a portion of the housing.

19. The system according to claim 15, wherein the counter support includes a second elastically deformable member.

20. The system according to claim 19, wherein the second elastically deformable member includes a metal material.

21. A system for transferring heat energy in an electronic assembly, the system comprising:
an electrical component;
a first elastically deformable member in thermal communication with the electrical component and having a compressed position that fixes the first elastically deformable member in an assembled location; and
wherein the first elastically deformable member includes a plurality of projections increasing the surface area to improve dissipation of heat energy.

22. A system for transferring heat energy in an electronic assembly, the system comprising:
an electrical component;
a first elastically deformable member in thermal communication with the electrical component and having a compressed position that fixes the first elastically deformable member in an assembled location;
a housing for protecting the electronic assembly, the first elastically deformable member being in thermal communication with the housing; and
wherein the housing includes a metal pad, the first elastically deformable member being soldered to the metal pad.

23. A system for transferring heat energy in an electronic assembly, the system comprising:
an electrical component;
a first elastically deformable member in thermal communication with the electrical component and having a compressed position that fixes the first elastically deformable member in an assembled location;
a housing for protecting the electronic assembly, the first elastically deformable member being in thermal communication with the housing, wherein the housing includes a recess for receiving the first elastically deformable member; and
wherein the first elastically deformable member includes at least one elastically deformable member for fixing the first elastically deformable member in the recess of the housing.

24. A system for transferring heat energy in an electronic assembly, the system comprising:
an electrical component;
a first elastically deformable member in thermal communication with the electrical component and having a compressed position that fixes the first elastically deformable member in an assembled location;
a printed circuit board in thermal communication with the electrical component;
a counter support to relieve mechanical stress caused by the first elastically deformable member; and
a housing for protecting the electronic assembly, the first elastically deformable member being in thermal communication with the housing.

25. The system according to claim 24, wherein a thermally conductive liquid is contained within the first elastically deformable member.

26. The system according to claim 24, further comprising a thermally conductive grease in thermal communication with the first elastically deformable member.

27. The system according to claim 24, wherein the first elastically deformable member has a shape corresponding to the shape of the electrical component.

28. The system according to claim 24, wherein the first elastically deformable member is mechanically attached to the housing.

29. The system according to claim 24, wherein the first elastically deformable member is soldered to the housing.

30. The system according to claim 24, wherein the housing includes a metal pad, the first elastically deformable member being soldered to the metal pad.

31. The system according to claim 24, wherein the first elastically deformable member includes plurality of members increasing the surface area to improve dissipation of heat energy.

32. The system according to claim 24, wherein the first elastically deformable member provides an electrical ground path to the housing.

33. The system according to claim 24, wherein the printed circuit board includes vias for conducting heat energy through the printed circuit board.

34. The system according to claim 24, wherein the counter support is located opposite the first elastically deformable member.

35. The system according to claim 24, wherein the counter support includes an elastomer material.

36. The system according to claim 24, wherein the counter support includes a member extending from the housing.

37. The system according to claim 24, wherein the counter support includes a second elastically deformable member.

38. The system according to claim 37, wherein the second elastically deformable member includes a metal material.

39. The system according to claim 24, wherein the housing includes a recess for receiving the first elastically deformable member.

40. The system according to claim 39, wherein the first elastically deformable member is press-fit into the recess of the housing.

41. The system according to claim 39, wherein the first elastically deformable member includes at least one elastically deformable member for fixing the first elastically deformable member in the recess of the housing.

* * * * *